(12) United States Patent
Faircloth

(10) Patent No.: US 12,640,698 B1
(45) Date of Patent: May 26, 2026

(54) ENVIRONMENTALLY ADAPTABLE ANTENNA

(71) Applicant: Daniel Faircloth, Huntsville, AL (US)

(72) Inventor: Daniel Faircloth, Huntsville, AL (US)

( * ) Notice: Subject to any disclaimer, the term of this patent is extended or adjusted under 35 U.S.C. 154(b) by 172 days.

(21) Appl. No.: 18/616,593

(22) Filed: Mar. 26, 2024

Related U.S. Application Data

(60) Provisional application No. 63/467,355, filed on May 18, 2023.

(51) Int. Cl.
*H01Q 23/00* (2006.01)
*H03H 1/00* (2006.01)

(52) U.S. Cl.
CPC .............. *H03H 1/00* (2013.01); *H01Q 23/00* (2013.01)

(58) Field of Classification Search
CPC ........ H01Q 1/22–24; H01Q 1/38; H01Q 1/50; H01Q 5/30–40; H01Q 23/00; H03H 1/00; H02J 7/007192
See application file for complete search history.

(56) References Cited

U.S. PATENT DOCUMENTS

| | | | | |
|---|---|---|---|---|
| 9,941,732 | B2 * | 4/2018 | Lundholm | ............ H02J 7/0013 |
| 10,050,463 | B2 * | 8/2018 | Manova-Elssibony | ...................... H02J 50/80 |
| 11,476,897 | B2 * | 10/2022 | Peralta | ..................... H04B 5/79 |
| 12,476,357 | B2 * | 11/2025 | Tamrakar | ............ H01Q 1/2283 |

* cited by examiner

*Primary Examiner* — Hasan Islam
(74) *Attorney, Agent, or Firm* — Lanier Ford Shaver & Payne, PC; Gerald M. Walsh

(57) ABSTRACT

A thermally adaptive antenna system having an antenna structure, an EM) power signal, a DC power signal, an impedance tuner, a temperature sensor in the antenna, a DC-DC conversion component, and a microcontroller. The microcontroller provides a tuning command to the impedance tuner, causing the impedance tuner to compensate for an impedance change in the antenna due to a temperature change in the antenna. An environmentally adaptive antenna system has an antenna structure, an EM power signal, a DC power signal, an EM power splitter, a directional coupler, a reference receiver, a measurement receiver, an impedance tuner, and a controller. The controller calculates antenna impedance change based on observed changes in return loss, calculates a corresponding correction to the antenna impedance, and sends a command to the impedance tuner to implement the correction to the antenna impedance.

5 Claims, 5 Drawing Sheets

ENVIRONMENTALLY ADAPTABLE ANTENNA

CROSS-REFERENCE TO RELATED APPLICATION

This application claims priority to U.S. Provisional Patent Application No. 63/467,355, filed on May 18, 2023, the contents of that application being incorporated herein by reference in its entirety.

BACKGROUND

Antennas act as a conduit to convert electromagnetic (EM) signals from electronics into a signal radiating into a medium such as free space and vice versa. As such, antennas play a critical role in the proper functioning of radar systems, communications systems, and other EM signal transmission applications. Antennas are often designed without regard to the environment in which they are placed. The term "environment" refers to both the physical placement and installation onto a host platform such as a vehicle or aircraft and to the conditions around the antenna such as temperature, vibration, and structural loading. Even when such consideration is given, design modifications and concessions are typically made based only on the physical and electrical survival of the antenna and not its EM performance. However, EM performance is obviously a critical factor in the overall performance of the system in which the antenna plays a role.

EM performance for an antenna is usually established based on an assessment, as a function of frequency, of S-parameters (or equivalently return loss or voltage standing wave ratio (VSWR)) and gain (or directivity or realized gain). Additional performance parameters may be derived from these two quantities, but fundamental performance of the antenna can be considered as these two quantities.

The environment in which the antenna operates can alter the as-designed VSWR and gain. FIG. 1 is a graph of an example of antenna thermal drift in which VSWR is shown for an antenna that was exposed to hot and cold thermal cycling over time. The antenna's VSWR was designed to be within certain values shown by the dashed line rectangle 10. However, the changes in temperature dramatically affect the VSWR, potentially even causing the antenna to fail.

FIG. 2A shows a platform coating on the platform skin 12 of an antenna structure 13 covering a radiating element 14 which is covered by a radome 15. An external heat flux 16 is applied to the antenna's radome 15. As the radome 15 heats, the permittivity of the radome 15 changes, thereby altering the impedance characteristics of the antenna and therefore, by definition, the VSWR and gain. FIG. 2B is a graph showing the relationship between temperature, antenna response, and frequency. FIG. 2B shows a measured performance shift due to thermal load. The dashed lines 17 illustrate the functional requirements bounds, with the stippled region 18 extending out of bounds with increasing temperature. The stippled region 18 should remain with the bounds 17. With increasing temperature, S11 (return loss) shifts and degrades, impacting the performance metrics for the antenna response.

There are a variety of factors that lead to a change in EM performance due to changes in environmental conditions. As seen in the FIGS. 2A and 2B, thermal loading affects performance through the temperature variability of the materials used in the construction of the antenna. For example, the permittivity of the materials of the radome and substrate has a dependence on temperature, sometimes a strong dependence, and, as such, has a change in feed. Similarly, vibrations, stresses, and strains can alter the permittivity of the materials or alter the as-designed shape and properties of metallic structures, which in turn alters the radiative and impedance characteristics of the antenna. In very harsh environments, such as a spacecraft on reentry, antenna radome materials will experience extreme aero-thermal environments inducing strong changes in permittivity and possibly ablation (geometry and chemical changes), charring (chemical changes), or both. In similar scenarios, plasma may also form over the antenna, in which case the plasma may be tightly coupled to the performance of the antenna and be treated as a dynamically changing material component of the antenna.

Since it is not realistic to expect antennas never to be exposed to such environmental conditions, antennas may be over-designed in terms of bandwidth or other performance parameters. More likely, other components of the system may be designed to compensate for the expected loss in performance of the antenna. Further, and worst of all, conservative design margins may be imposed because system designers know something will affect performance, but they do not take time to characterize and design mitigations for the root causes of EM performance degradation. It is known to use impedance in an antenna to monitor environmental conditions (see U.S. Pat. No. 4,169,543). However, what is needed is a system and method to compensate for changes in antenna impedance caused by environmental conditions.

SUMMARY OF THE DISCLOSURE

Disclosed herein are thermally and environmentally adaptive antenna systems. A thermally adaptive antenna system comprises an antenna structure having an electromagnetic (EM) power signal, a DC power signal, an impedance tuner, a temperature sensor in the antenna, a DC-DC conversion component, and a microcontroller. The EM power signal goes to the antenna and the DC power signal goes to a microcontroller. The temperature sensor collects and sends temperature data to the microcontroller. The microcontroller provides a tuning command to the impedance tuner, causing the impedance tuner to compensate for an impedance change in the antenna due to a temperature change in the antenna. The microcontroller is programmed with a look-up table that converts observed temperature to an impedance tuner setting which corresponds to a desired impedance compensation term. A Bias-T receives the EM power signal and the DC power signal. The Bias-T directs the EM power signal to an antenna and the DC power signal to a DC-DC conversion component. The impedance tuner is in line with the signal propagation path and the antenna structure. The DC-DC conversion component provides DC voltage and power to the microcontroller, the impedance tuner, and the temperature sensor in the antenna.

An environmentally adaptive antenna system comprises an antenna structure, an EM power signal, a DC power signal, an EM power splitter, a directional coupler, a reference receiver, a measurement receiver, an impedance tuner, and a microcontroller. The EM power signal goes to the EM power splitter and from the EM power splitter to the directional coupler and to the reference receiver. The EM power signal also goes from the reference receiver to the controller, from the directional coupler to and from the antenna structure and to the measurement receiver, and from the measurement receiver to the controller. The controller calculates antenna impedance change based on observed changes in return loss, calculates a corresponding correction to the antenna impedance, and sends a command to the impedance tuner to implement the correction to the antenna impedance.

The bias-T sends the EM power signal to the EM power splitter and sends the DC power signal to a DC-DC conversion component. The DC-DC conversion component, the reference receiver, and the measurement receiver send the EM power signal to an analog to digital converter. The antenna system may be a transmit only antenna system.

Another environmentally adaptive antenna system comprises an antenna structure, and EM power signal or a reference EM power signal or a switch for selecting an EM power signal or a reference EM power signal, a DC power supply, an EM power splitter, a directional coupler, a reference receiver, a measurement receiver, an impedance tuner, and a microcontroller. The EM power signal or the reference EM power signal goes to the EM power splitter and from the EM power splitter to the directional coupler and to the reference receiver. The EM power signal or the reference EM power signal goes from the reference receiver to the controller, from the directional coupler to and from the antenna structure and to the measurement receiver, and from the measurement receiver to the controller. The controller calculates antenna impedance change based on observed changes in return loss, calculates a corresponding correction to the antenna impedance, and sends a command to the impedance tuner to implement the correction to the antenna impedance.

The reference receiver and the measurement receiver send the EM power signal or the reference EM power signal to an analog to digital converter. The measurement receiver sends the EM power signal or the reference EM power signal to an EM power splitter. The measurement receiver also sends the reference EM power signal to a receiver of the antenna for filtering out through standard signal processing. The antenna system may be a receiving only antenna, a half-duplex transmit-receive antenna, or a full-duplex antenna.

The thermally and environmentally adaptive antennas of this disclosure have numerous advantages over existing antennas. Both types of antennas use simple electronics. The thermally adaptive antenna solves the problem of antenna detuning due to thermal loading and is a self-contained package that only requires an RF connection with DC power provided over the signal line. The active environment compensation of the environmentally adaptable antenna solves the problem of antenna detuning when the environmental factors are either unknown or cannot readily be characterized a priori. The environmentally adaptable antenna solves antenna detuning for all four types of antenna operation: transmit-only, receive-only, half-duplex, and full-duplex and it provides a self-contained package that only requires an RF connection and DC power.

DESCRIPTION OF THE DISCLOSURE

While the following description details the preferred embodiments of the systems and devices of this disclosure, it is to be understood that the systems and devices are not limited in their application to the details of arrangement of the features or components described in the disclosure, since the systems and devices are capable of other embodiments and of being practiced in various ways.

The environmentally adaptive antenna of this disclosure mitigates the problems described above by incorporating environmental sensors into the antenna structure along with an active impedance tuning circuit. Together, these elements, along with a properly designed support structure and radiating element, dramatically improve the performance of the antenna due to changing environmental conditions. Thermally induced changes in an antenna's performance and changes induced by other multiple known or unknown factors are mitigated by the system and methods of this disclosure which provide thermal compensation using environmental sensors.

In many situations, the thermal conditions to which the antenna will be exposed are known ahead of time. This may simply be a range of temperatures (e.g., a temperature rating for the antenna of −20 to +80° C.) or a specific thermal exposure profile over time. Thus, to compensate for these temperature changes, the permittivity of any or all materials within the antenna vs. temperature must be known and catalogued. Then, using temperature sensors embedded at key locations within the antenna structure and a microcontroller with a temperature-to-impedance look-up table, an active tuning circuit compensates for the induced impedance changes. This system and method provide a thermally adaptive antenna.

Figure 1:
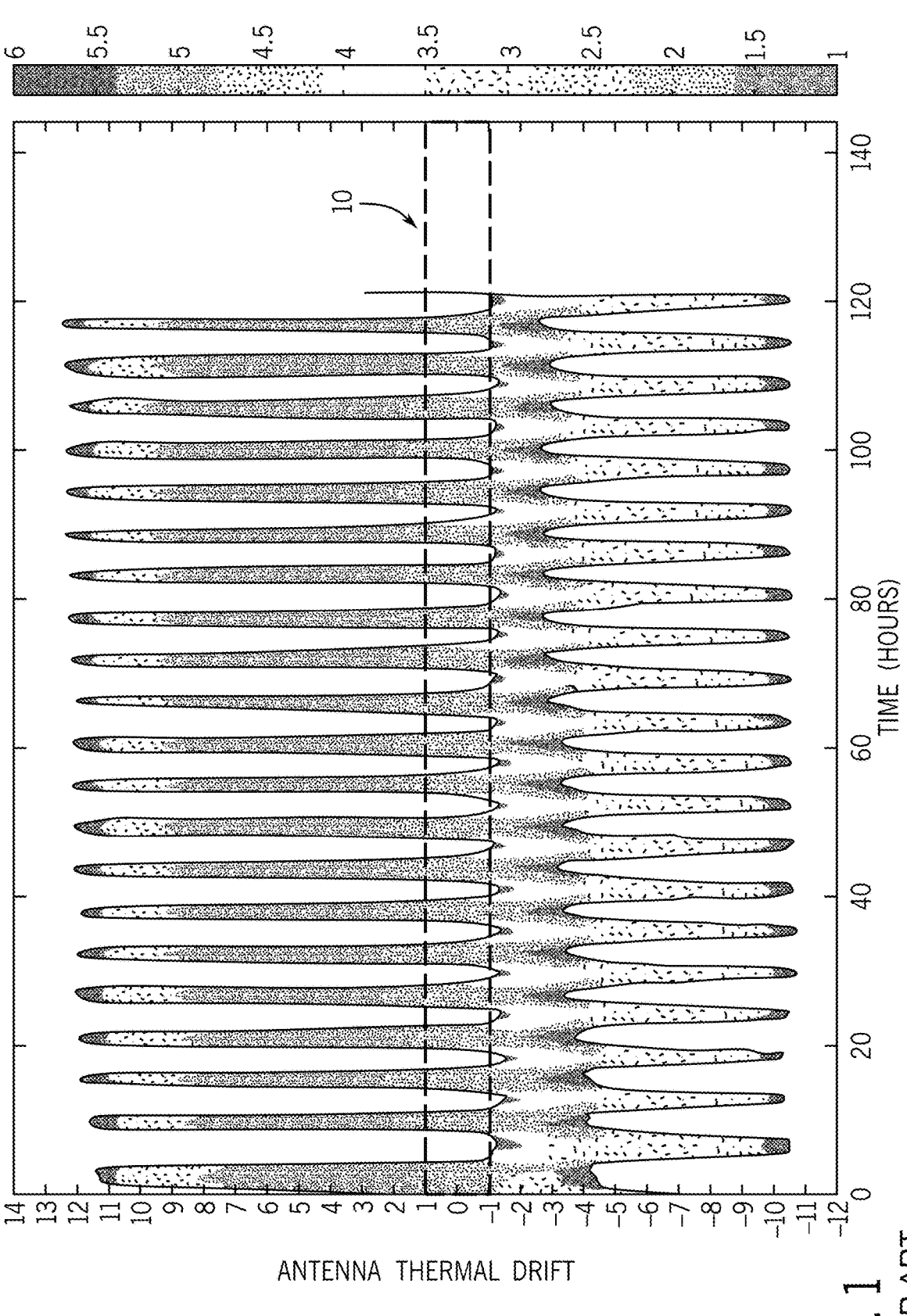
FIG. 1 is a graph illustrating an example in which an antenna is exposed to hot and cold thermal cycling.
Figures 2A, 2B:
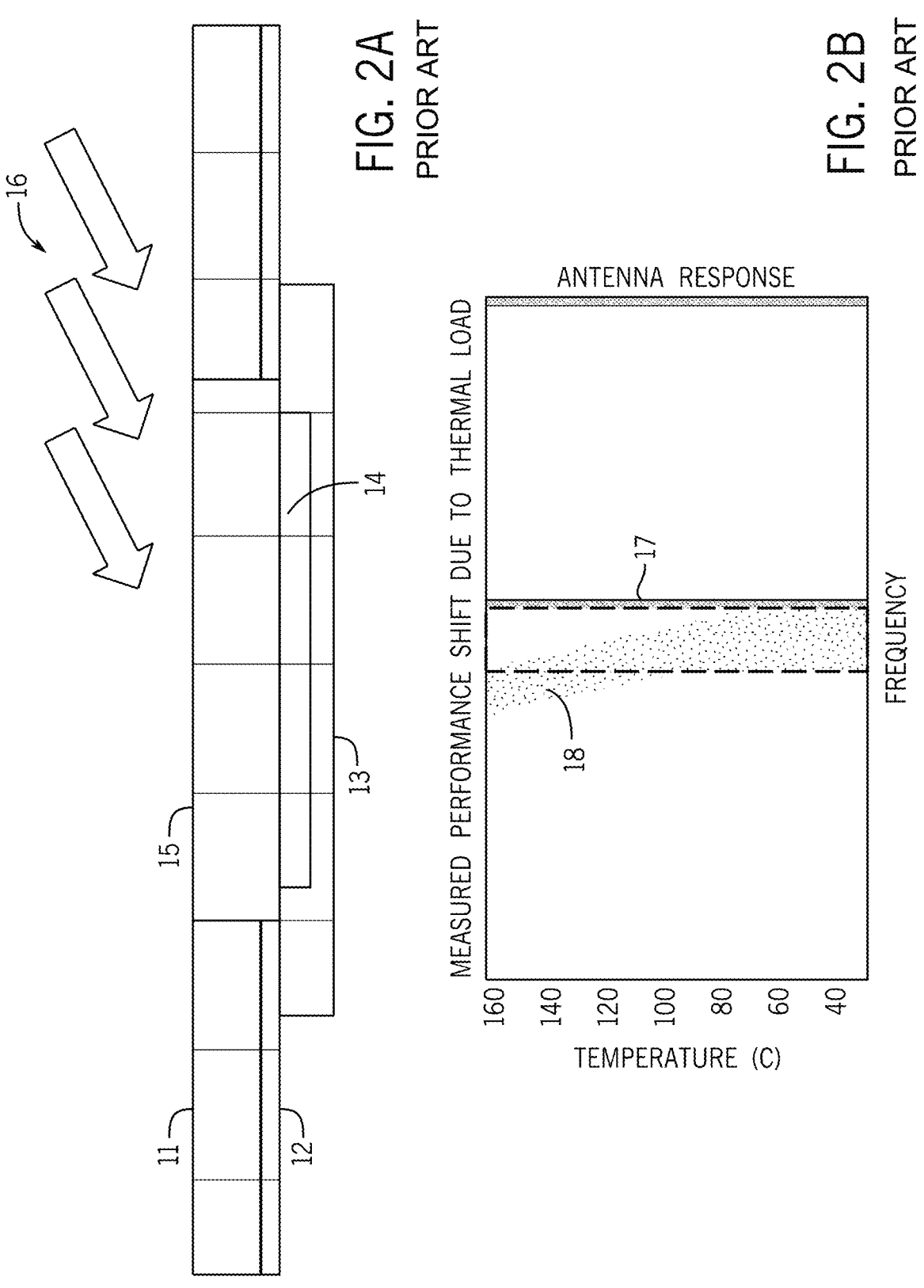
FIG. 2 illustrates an example in which an external heat flux is applied to a radome of an antenna.
Figures 3, 4:
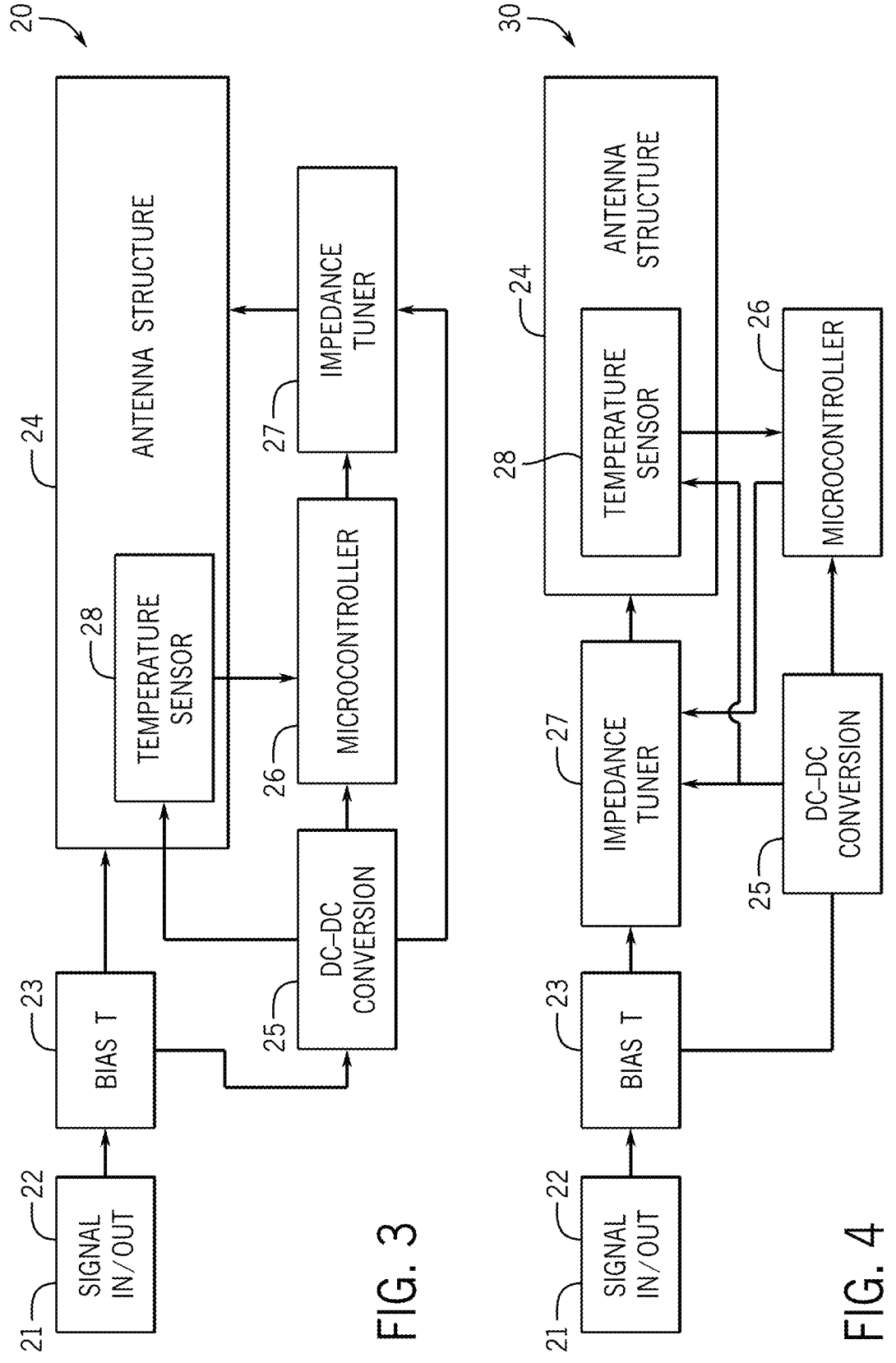
FIG. 3 is a block diagram of the components of the thermally adaptive antenna of this disclosure having an impedance tuner acting as a load on the antenna.
FIG. 4 shows an alternative block diagram for a thermally adaptive antenna in which the impedance tuner is an in-line load for the antenna.

FIG. 3 is a block diagram of the components of the thermally adaptive antenna 20 having an impedance tuner 27 acting as a load on the antenna. On transmit by the antenna 20 the EM power signal 21 and DC power signals 22 go into a Bias-T 23. The Bias-T 23 splits the EM signal 21, which goes to the antenna structure 24, from the DC power signal 22, which then goes to a DC-DC conversion component 25. The DC-DC conversion component 25 provides proper DC voltage and power to the microcontroller 26, active impedance tuner 27, and the temperature sensor(s) 28. Throughout operation, the temperature sensor 28 collects data that is sent to the microcontroller 26. The microcontroller 26 performs a look-up function into a look-up table for 27. The impedance tuner 27 functions as an external load on the antenna structure 24 and compensates for impedance change due to thermal loading. On receiving by the antenna 20, the EM signal propagation direction is simply reversed, and all other elements remain the same.

FIG. 4 shows an alternative block diagram for a thermally adaptive antenna 30 in which the impedance tuner is an in-line element of the signal propagation path. The choice of design between that of FIG. 3 and that of FIG. 4 is based on the type of antenna and any number of factors including the type of antenna geometry, installation method, polarization, bandwidth, gain, power handling, and frequency of operation.

The microcontroller 26 is programmed with data for converting observed temperature to an impedance tuner 27 setting, which corresponds to a desired impedance compensation term.

The process for creating the look-up table includes:
1. Identifying materials to be used in the antenna.
2. Creating the baseline antenna design.
3. Simulating or measuring the temperature within the materials under the range of expected thermal conditions. This step depends on data or engineering judgement regarding locations of key thermal sensitivity or degree of thermal variation over the antenna geometry.
4. Identifying one or more locations to place temperature sensors based on the data from Step 3.
5. Characterizing the permittivity (and permeability for magnetic materials) vs temperature and cataloguing the data in the look-up table.
6. Simulating the antenna using material property data at different temperatures.
7. Calculating the VSWR (or return loss) over the frequency band of interest for each temperature.
8. Calculating the impedance change required to compensate for the thermally induced changes in material properties.
9. Creating the look-up table for temperature vs. compensation impedance.
10. Loading the look-up table into the microcontroller.

Active Environment Compensation

The advantage of the thermally adaptive antenna is the simplicity of the design for thermal compensation. However, many scenarios exist in which a simple look-up table cannot provide accurate data for real-time tuning when the factors impacting environmental conditions are unknown or varied. For example, when the radome of the antenna erodes due to wind, rain, or other particles or ablates due to temperate conditions, these scenarios involve multiple physics inducing a variety of changes in the antenna. Attempting to uniquely detect each condition that affects EM performance is challenging and unnecessarily drives system complexity, cost, and design preparation.

During operation, it is less important to know why the EM performance degraded than how it is degraded as ascertained by available observable data. A preferred way to observe degradation is through the EM performance itself. Since, from the perspective of the self-contained antenna, the gain is not observable, the alternative is to observe changes in the VSWR.

Figures 5, 6:
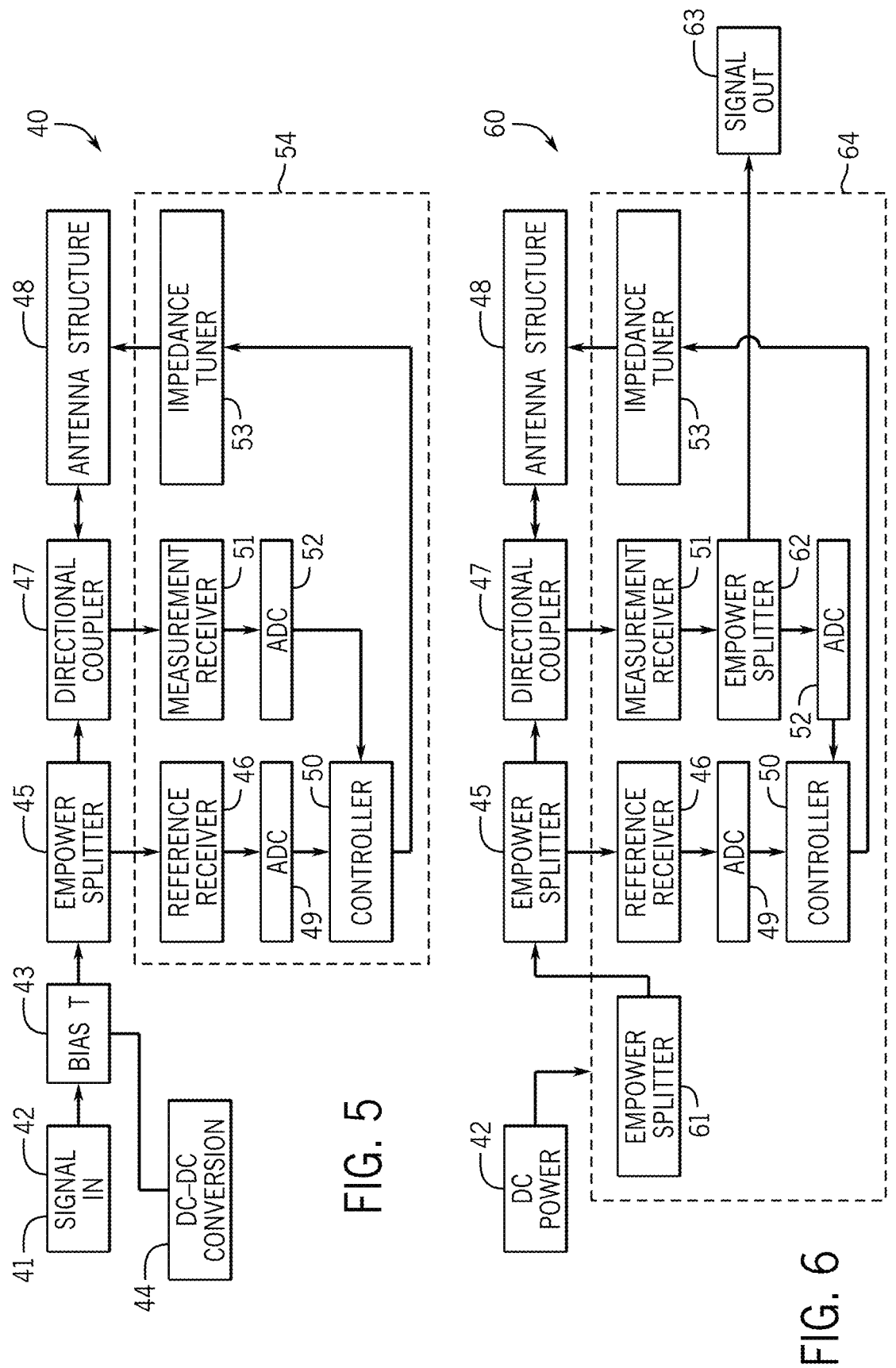
FIG. 5 is a block diagram of active environment compensation for a transmit-only application.
FIG. 6 is a block diagram of active environment compensation for a receive-only application.

FIG. 5 is a block diagram 40 of active environment compensation for a transmit-only antenna. The EM power signal 41 is transmitted, along with the DC power signal 42, through a Bias-T 43 that separates the EM power signal 41 from the DC power signal 42. The DC power signal 42 goes to a DC-DC conversion 44 component that provides appropriate power to each component within the antenna. The EM power signal 41 enters a power splitter 45, which directs energy to a reference receiver 46 and a directional coupler 47. The directional coupler 47 passes the signal 41 through to the antenna's radiating structure 48, which then emits the signal 41 into the propagation medium. The reference receiver 46 signal is digitized via an analog to digital converter (ADC) 49, and the digital signal goes to a controller 50 for processing. Invariably, at the antenna structure 48, there is a reflection of some portion of the EM power signal 41, even under ideal conditions. This reflected EM power signal 41 enters back into the directional coupler 47 and passes through to the measurement receiver 51. Like the reference receiver 46, the measurement receiver 51 passes the signal 41 to an ADC 52 and on to the controller 50. DC power is provided to all elements within the dashed line 54.

Within the controller 50, the return loss over the signal bandwidth is calculated and compared to a historical reference signal measured previously and stored as a reference. The reference signal may be measured during production, at antenna turn-on, or periodically throughout the life of the antenna. Based on the observed changes in the return loss, the apparent impedance change is calculated. The corresponding impedance correction is then calculated, and a command is sent from the controller 50 to the impedance tuner 53 connected to the antenna structure 48 to implement the impedance change.

FIG. 6 shows the block diagram for a receive-only variant of the antenna 40, antenna 60. With antenna 60 there is no transmitting signal from which to form a reference. Thus, a reference signal 61 generator is included that provides a reference signal 61 to the power splitter 45. This signal 61 goes to a reference receiver 46 and directional coupler 47 as in the transmit-only case. The signal from the measurement receiver 51 passes through a power splitter 62 and on to the ADC 52. Since the reference signal 61 is known and can be filtered out through standard signal processing by the antenna's receiver 63 (as represented by the Signal Out), it does not interfere with the antenna's actual received signal of interest. Within the controller, the reflected measured signal and the reference signal 61 are used to calculate the return loss, and the compensation mechanism is the same as the transmit-only case. DC power is provided to all elements within the dashed line 64.

Figures 7, 8:
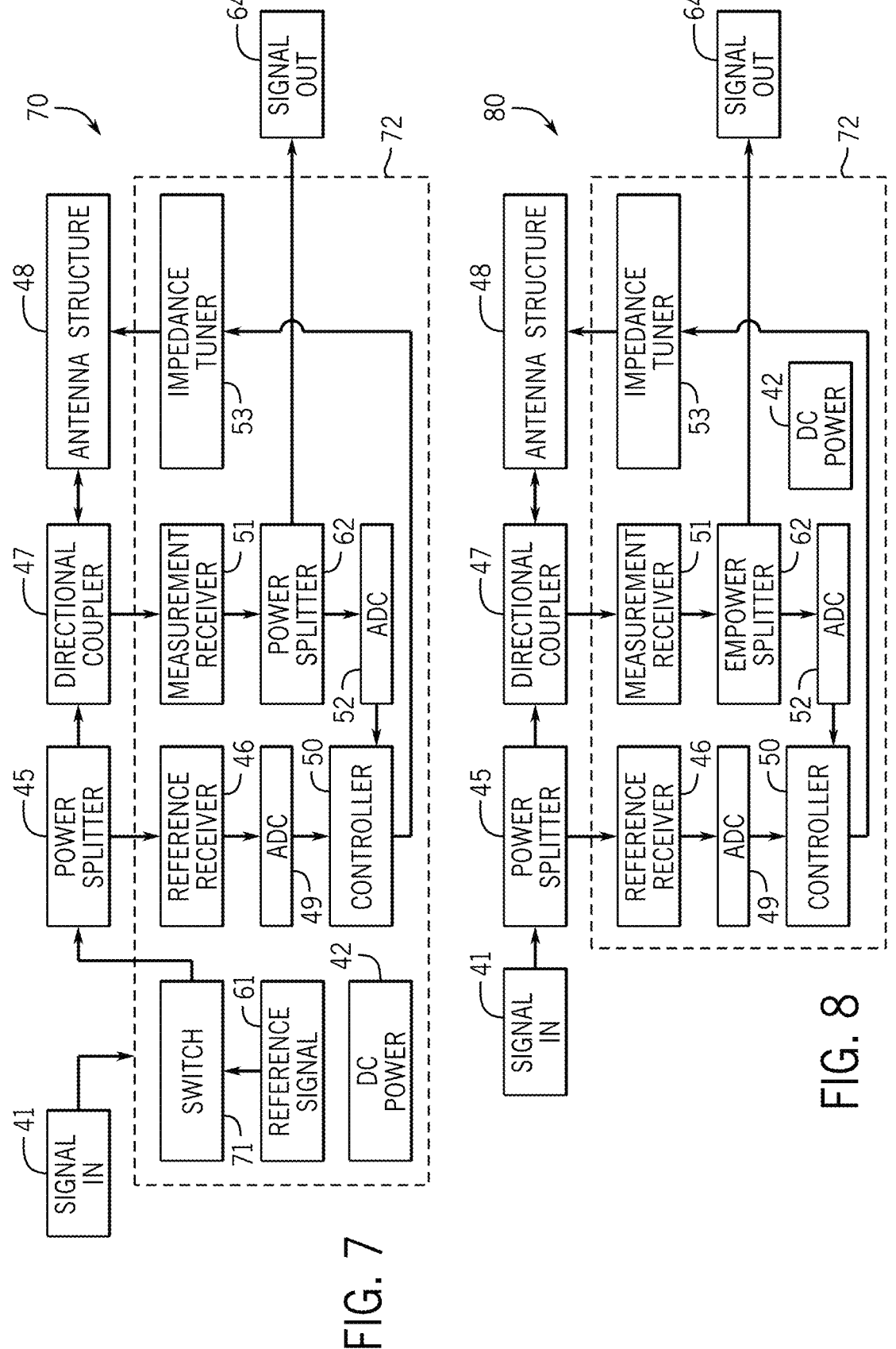
FIG. 7 is a block diagram of active environment compensation for a half-duplex application.
FIG. 8 is a block diagram of active environment compensation for a full-duplex application.

FIG. 7 shows a block diagram of active environment compensation for a half-duplex transmit-receive antenna 70. The primary difference in this case is a switch 71 providing operation for both transmit and receive modes. DC power is provided to all elements within the dashed line 72. Depending on the expected duty cycle of the switching within the antenna 70 and the desired update rate for the impedance tuning, the switch 71 may be eliminated such that impedance tuning updates are only performed in transmit mode.

FIG. 8 is a block diagram of active environment compensation for a full-duplex antenna. In this case, the switch 71 is removed, and impedance tuning is only performed based on the transmit signal as reference.

The foregoing description illustrates and describes the systems and devices of the disclosure. Additionally, the disclosure shows and describes only the preferred embodiments but as mentioned above, it is to be understood that the preferred embodiments are capable of being formed in various other combinations, modifications, and environments and are capable of changes or modifications within the scope of the invention concepts as expressed herein, commensurate with the above teachings and/or the skill or knowledge of the relevant art. The embodiments described herein above are further intended to explain the best modes known by applicant and to enable others skilled in the art to utilize the disclosure in such, or other, embodiments and with the various modifications required by the particular application or uses thereof. Accordingly, the description is not intended to limit the disclosure to the form disclosed herein. Also, it is intended that the appended claims be construed to include alternative embodiments. It will be further understood that various changes in the details, materials, and arrangements of the parts which have been described and illustrated above to explain the nature of this invention may be made by those skilled in the art without departing from the principle and scope of the invention as recited in the following claims.

What is claimed is:

1. A thermally adaptive antenna system, comprising:

an antenna structure, an electromagnetic (EM) power signal, a DC power signal, a Bias-T, an impedance tuner, a temperature sensor in the antenna structure, a DC-DC conversion component, and a microcontroller, wherein the EM power signal goes to the antenna structure via the Bias-T and the DC power signal goes to the microcontroller via the Bias-T, wherein the temperature sensor collects and sends temperature data to the microcontroller, and wherein the microcontroller provides a tuning command to the impedance tuner, causing the impedance tuner to compensate for an impedance change in the antenna structure due to a temperature change in the antenna structure.

2. The thermally adaptive antenna system of claim 1 wherein the microcontroller is programmed with a look-up table that converts observed temperature to an impedance tuner setting which corresponds to a desired impedance compensation term.

3. The thermally adaptive antenna system of claim 1 wherein a bias-T receives the EM power signal and the DC power signal and wherein the bias T directs the EM signal to an antenna structure and the DC power signal to a DC-DC conversion component.

4. The thermally adaptive antenna system of claim 1 wherein the impedance tuner is in line with the signal propagation path and the antenna structure.

5. The thermally adaptive antenna system of claim 1 wherein the DC-DC conversion component provides DC voltage and power to the microcontroller, the impedance tuner, and the temperature sensor in the antenna structure.

* * * * *